United States Patent
Yoo et al.

(10) Patent No.: US 9,695,287 B2
(45) Date of Patent: Jul. 4, 2017

(54) CURABLE ORGANO POLYSILOXANE COMPOSITION, ENCAPSULANT, AND ELECTRONIC DEVICE

(71) Applicant: SAMSUNG SDI CO., LTD., Yongin-si, Gyeonggi-do (KR)

(72) Inventors: Hong-Jung Yoo, Suwon-si (KR); Sang-Ran Koh, Suwon-si (KR); Young-Ho Kim, Suwon-si (KR); Woo-Han Kim, Suwon-si (KR); Dong-Ju Shin, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/867,861

(22) Filed: Sep. 28, 2015

(65) Prior Publication Data

US 2016/0093825 A1 Mar. 31, 2016

(30) Foreign Application Priority Data

Sep. 30, 2014 (KR) .................. 10-2014-0131836

(51) Int. Cl.
| C08G 77/08 | (2006.01) |
|---|---|
| C08G 77/60 | (2006.01) |
| C09D 183/14 | (2006.01) |
| C08G 77/50 | (2006.01) |
| H01L 23/29 | (2006.01) |
| C08L 83/14 | (2006.01) |
| C08L 83/04 | (2006.01) |
| H01L 51/52 | (2006.01) |
| C08G 77/12 | (2006.01) |
| C08G 77/20 | (2006.01) |

(52) U.S. Cl.
CPC ............ *C08G 77/60* (2013.01); *C08G 77/50* (2013.01); *C09D 183/14* (2013.01); *C08G 77/12* (2013.01); *C08G 77/20* (2013.01); *C08L 83/04* (2013.01); *C08L 83/14* (2013.01); *H01L 23/296* (2013.01); *H01L 51/5253* (2013.01)

(58) Field of Classification Search
CPC ......... C08L 83/04; C08L 83/14; H01L 23/296
See application file for complete search history.

(56) References Cited

U.S. PATENT DOCUMENTS

| 2009/0012256 A1* | 1/2009 | Omi ................. C08G 77/12 528/31 |
| 2009/0069525 A1* | 3/2009 | Moloy ............... C08L 83/04 528/31 |
| 2011/0064882 A1* | 3/2011 | Mizushima .......... C09D 183/04 427/386 |
| 2014/0275445 A1* | 9/2014 | Yamanaka ............ C08G 77/04 525/476 |

FOREIGN PATENT DOCUMENTS

| JP | 2004-339482 A | 12/2004 |
| JP | 2010-248446 A | 11/2010 |
| JP | 2011-256251 A | 12/2011 |
| JP | 5170471 B2 | 1/2013 |
| JP | 5294414 B2 | 6/2013 |
| KR | 10-2012-0007401 A | 1/2012 |
| KR | 10-2012-0017397 A | 2/2012 |
| KR | 10-1277722 B1 | 6/2013 |
| KR | 10-2014-0074241 A | 6/2014 |
| KR | 10-2015-0066969 A | 6/2015 |
| WO | 2013/061823 * | 5/2013 |

* cited by examiner

*Primary Examiner* — Margaret Moore
(74) *Attorney, Agent, or Firm* — Lee & Morse, P.C.

(57) ABSTRACT

A curable organo polysiloxane composition, an encapsulant, and an electronic device, the composition including at least one compound represented by the following Chemical Formula 1 and having a number average molecular weight of less than about 4,000, at least one first siloxane compound including a silicon-bonded hydrogen; and at least one second siloxane compound including a silicon-bonded alkenyl group:

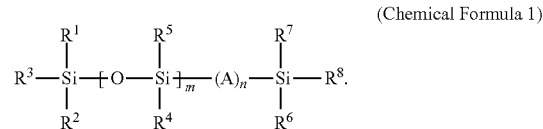

(Chemical Formula 1)

14 Claims, 1 Drawing Sheet

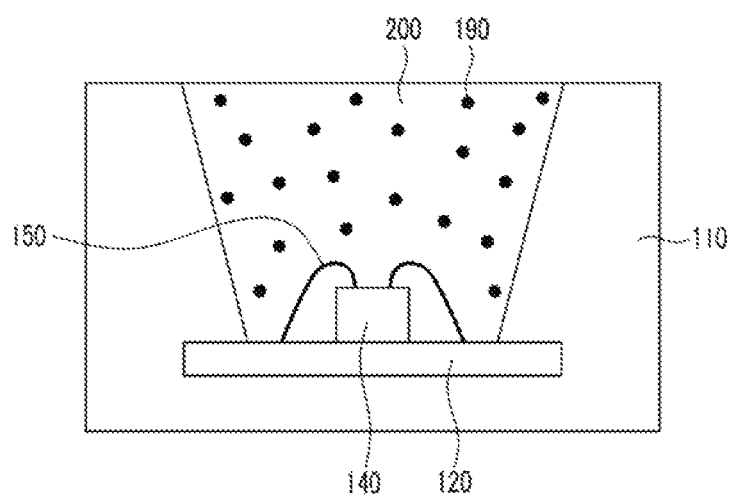

CURABLE ORGANO POLYSILOXANE COMPOSITION, ENCAPSULANT, AND ELECTRONIC DEVICE

CROSS-REFERENCE TO RELATED APPLICATION

Korean Patent Application No. 10-2014-0131836, filed on Sep. 30, 2014, in the Korean Intellectual Property Office, and entitled: "Curable Organo Polysiloxane Composition, Encapsulant, and Electronic Device," is incorporated by reference herein in its entirety.

BACKGROUND

1. Field

Embodiments relate to a curable organo polysiloxane composition, an encapsulant, and an electronic device.

2. Description of the Related Art

A light emitting device such as a light emitting diode (LED), an organic light emitting device (OLED), and a photoluminescence (PL) device has been variously applied to a domestic electric device, a lighting device, a display device, various automatic devices, and the like. The light emitting device may display intrinsic colors of a light emitting material such as blue, red, and green in a light emission part, or white by combining light emitters displaying different colors.

SUMMARY

Embodiments are directed to a curable organo polysiloxane composition, an encapsulant, and an electronic device The embodiments may be realized by providing a curable organo polysiloxane composition including at least one compound represented by the following Chemical Formula 1 and having a number average molecular weight of less than about 4,000, at least one first siloxane compound including a silicon-bonded hydrogen; and at least one second siloxane compound including a silicon-bonded alkenyl group:

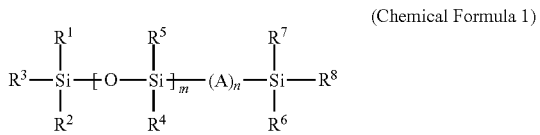

(Chemical Formula 1)

wherein, in Chemical Formula 1, A is selected from a substituted or unsubstituted C1 to C21 alkylene group, a substituted or unsubstituted C3 to C12 cycloalkylene group, a substituted or unsubstituted C6 to C30 heterocycloalkylene group, a substituted or unsubstituted C2 to C20 alkenylene group, a substituted or unsubstituted C2 to C20 alkynylene group, a substituted or unsubstituted C6 to C30 arylene group, a substituted or unsubstituted C2 to C30 heteroarylene group, or a combination thereof, $R^1$ to $R^8$ are each independently selected from hydrogen, a substituted or unsubstituted C1 to C21 alkyl group, a substituted or unsubstituted C7 to C20 arylalkyl group, a substituted or unsubstituted C1 to C20 heteroalkyl group, a substituted or unsubstituted C3 to C12 cycloalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C1 to C10 alkoxy group, a substituted or unsubstituted C1 to C30 acyl group, a hydroxy group, a halogen, or a combination thereof, two or more of $R^1$ to $R^8$ being a substituted or unsubstituted C2 to C20 alkenyl group, m is an integer of 0 to 5, and n is an integer of 1 to 10.

A may be selected from a substituted or unsubstituted C1 to C10 alkylene group, a substituted or unsubstituted C3 to C12 cycloalkylene group, a substituted or unsubstituted C6 to C20 arylene group, or a combination thereof.

The at least one compound represented by Chemical Formula 1 may include a compound represented by one of the following Chemical Formula 2 to Chemical Formula 4:

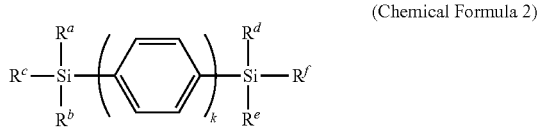

(Chemical Formula 2)

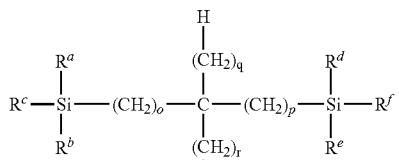

(Chemical Formula 3)

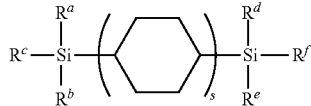

(Chemical Formula 4)

wherein, in Chemical Formulae 2 to 4, $R^a$ to $R^f$ may each independently be selected from hydrogen, a hydroxy group, a substituted or unsubstituted C1 to C10 alkyl group, a substituted or unsubstituted C2 to C12 alkenyl group, a substituted or unsubstituted C2 to C12 alkynyl group, a substituted or unsubstituted C1 to C10 alkoxy group, a substituted or unsubstituted C6 to C10 aryl group, a halogen, or a combination thereof, at least one of $R^a$ to $R^c$ may be a substituted or unsubstituted C2 to C12 alkenyl group, at least one of $R^d$ to $R^f$ may be a substituted or unsubstituted C2 to C12 alkenyl group, k may be an integer of 1 to 3, o and p may each independently be an integer of 1 to 5, q and r may each independently be an integer of 0 to 5, and s may be an integer of 1 to 3.

The at least one compound represented by Chemical Formula 1 may include a compound represented by one of the following Chemical Formula 8 to Chemical Formula 11:

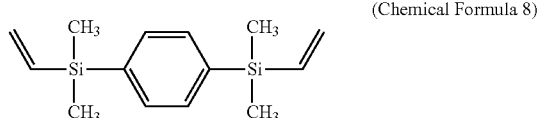

(Chemical Formula 8)

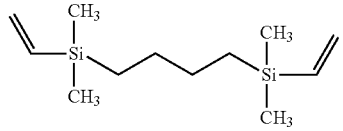

(Chemical Formula 9)

-continued

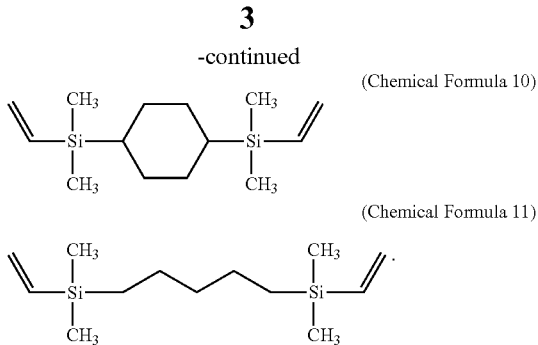

(Chemical Formula 10)

(Chemical Formula 11)

m may be an integer of 0 to 2.

n may be an integer of 1 to 3.

The at least one compound represented by Chemical Formula 1 may be included in the composition in an amount of about 0.1 wt % to about 20 wt %, based on a total weight of the composition.

The at least one first siloxane compound may include a compound represented by the following Chemical Formula 5:

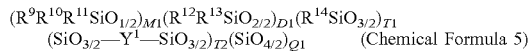

$(R^9R^{10}R^{11}SiO_{1/2})_{M1}(R^{12}R^{13}SiO_{2/2})_{D1}(R^{14}SiO_{3/2})_{T1}$
$(SiO_{3/2}-Y^1-SiO_{3/2})_{T2}(SiO_{4/2})_{Q1}$ (Chemical Formula 5)

wherein, in Chemical Formula 5, $R^9$ to $R^{14}$ may each independently be selected from a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a substituted or unsubstituted C1 to C30 acyl group, a hydroxy group, a halogen, or a combination thereof, two or more of $R^9$ to $R^{14}$ being hydrogen, $Y^1$ may be selected from a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M1<1$, $0≤D1<1$, $0≤T1<1$, $0≤T2<1$, $0≤Q1<1$, and $M1+D1+T1+T2+Q1=1$.

At least one of $R^9$ to $R^{14}$ of Chemical Formula 5 may be a substituted or unsubstituted C6 to C20 aryl group.

The at least one first siloxane compound may be included in the composition in an amount of about 10 wt % to about 49 wt %, based on a total weight of the composition.

The at least one second siloxane compound may include a compound represented by the following Chemical Formula 6:

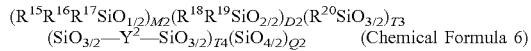

$(R^{15}R^{16}R^{17}SiO_{1/2})_{M2}(R^{18}R^{19}SiO_{2/2})_{D2}(R^{20}SiO_{3/2})_{T3}$
$(SiO_{3/2}-Y^2-SiO_{3/2})_{T4}(SiO_{4/2})_{Q2}$ (Chemical Formula 6)

wherein, in Chemical Formula 6, $R^{15}$ to $R^{20}$ may each independently be selected from hydrogen, a substituted or unsubstituted C1 to C20 alkyl group, a substituted or unsubstituted C7 to C20 arylalkyl group, a substituted or unsubstituted C1 to C20 heteroalkyl group, a substituted or unsubstituted C3 to C20 cycloalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C6 to C20 aryl group, a substituted or unsubstituted C1 to C10 alkoxy group, a substituted or unsubstituted C1 to C30 acyl group, a hydroxy group, a halogen, or a combination thereof, two or more of $R^{15}$ to $R^{20}$ being a substituted or unsubstituted C2 to C20 alkenyl group, $Y^2$ may be selected from a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M2<1$, $0≤D2<1$, $0<T3<1$, $0≤T4<1$, $0≤Q2<1$, and $M2+D2+T3+T4+Q2=1$.

The at least one second siloxane compound may further include a compound represented by the following Chemical Formula 7:

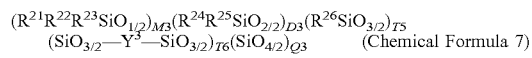

$(R^{21}R^{22}R^{23}SiO_{1/2})_{M3}(R^{24}R^{25}SiO_{2/2})_{D3}(R^{26}SiO_{3/2})_{T5}$
$(SiO_{3/2}-Y^3-SiO_{3/2})_{T6}(SiO_{4/2})_{Q3}$ (Chemical Formula 7)

wherein, in Chemical Formula 7, $R^{21}$ to $R^{26}$ may each independently be selected from hydrogen, a substituted or unsubstituted C1 to C20 alkyl group, a substituted or unsubstituted C7 to C20 arylalkyl group, a substituted or unsubstituted C1 to C20 heteroalkyl group, a substituted or unsubstituted C3 to C20 cycloalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C6 to C20 aryl group, a substituted or unsubstituted C1 to C10 alkoxy group, a substituted or unsubstituted C1 to C30 acyl group, a hydroxy group, a halogen, or a combination thereof, two or more of $R^{21}$ to $R^{26}$ may be a substituted or unsubstituted C2 to C20 alkenyl group, $Y^3$ may be selected from a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M3<1$, $0<D3<1$, $0≤T5<1$, $0≤T6<1$, $0≤Q3<1$, and $M3+D3+T5+T6+Q3=1$.

The compound represented by Chemical Formula 7 may be included in the composition in an amount of about 0.1 wt % to about 20 wt %, based on a total weight of the composition.

The at least one second siloxane compound may be included in the composition in an amount of about 50 wt % to about 89 wt %, based on a total weight of the composition.

The embodiments may be realized by providing an encapsulant obtained by curing the composition according to an embodiment.

The embodiments may be realized by providing an electronic device including the encapsulant according to an embodiment.

BRIEF DESCRIPTION OF THE DRAWING

Features will be apparent to those of skill in the art by describing in detail exemplary embodiments with reference to the attached drawing in which:

FIG. 1 illustrates a schematic cross-sectional view of a light emitting diode according to one embodiment.

DETAILED DESCRIPTION

Example embodiments will now be described more fully hereinafter with reference to the accompanying drawing;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening elements may also be present. In addition, it will also be understood that when an element is referred to as being "between" two elements, it can be the only element between the two elements, or one or more intervening elements may also be present. Like reference numerals refer to like elements throughout.

As used herein, when a definition is not otherwise provided, the term "substituted" refers to one substituted with at least a substituent selected from a halogen (F, Br, Cl, or I), a hydroxy group, an alkoxy group, a nitro group, a cyano group, an amino group, azido group, an amidino group, a hydrazino group, a hydrazono group, a carbonyl group, a carbamyl group, a thiol group, ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C30 heteroalkyl group, a C3 to C30 heteroarylalkyl group, a C3 to C30 cycloalkyl group, a C3 to C30 cycloalkenyl group, a C6 to C30 cycloalkynyl group, a C3 to C30 heterocycloalkyl group, and a combination thereof, instead of hydrogen of a compound.

As used herein, when a definition is not otherwise provided, the term "hetero" refers to one including 1 to 3 heteroatoms selected from N, O, S, and P.

Hereinafter, a curable organo polysiloxane composition according to one embodiment is described.

According to one embodiment, a curable organo polysiloxane composition may include, e.g., at least one compound (a) represented by Chemical Formula 1 and having a number average molecular weight of less than about 4,000, at least one first siloxane compound (b) including a silicon-bonded hydrogen (Si—H), and at least one second siloxane compound (c) including a silicon-bonded alkenyl group (Si—Vi).

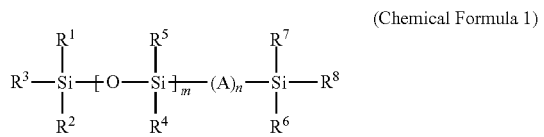

(Chemical Formula 1)

In Chemical Formula 1,

A may be selected from or include, e.g., a substituted or unsubstituted C1 to C21 alkylene group, a substituted or unsubstituted C3 to C12 cycloalkylene group, a substituted or unsubstituted C6 to C30 heterocycloalkylene group, a substituted or unsubstituted C2 to C20 alkenylene group, a substituted or unsubstituted C2 to C20 alkynylene group, a substituted or unsubstituted C6 to C30 arylene group, a substituted or unsubstituted C2 to C30 heteroarylene group, or a combination thereof.

$R^1$ to $R^8$ may each independently be selected from or include, e.g., hydrogen, a substituted or unsubstituted C1 to C20 alkyl group, a substituted or unsubstituted C7 to C20 arylalkyl group, a substituted or unsubstituted C1 to C20 heteroalkyl group, a substituted or unsubstituted C3 to C12 cycloalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C1 to C10 alkoxy group, a substituted or unsubstituted C1 to C30 acyl group, a hydroxy group, a halogen, or a combination thereof.

In an implementation, two or more of $R^1$ to $R^8$ may be or may include, e.g., a substituted or unsubstituted C2 to C20 alkenyl group.

m may be an integer of 0 to 5, and n may be an integer of 1 to 10.

The curable organo polysiloxane composition including a compound (a) represented by Chemical Formula 1 may include a compound including a bonding region of silicon and carbon in the main chain rather than a simple siloxane repeating unit. Thus, the compound may exhibit improved mechanical properties and resistance against a thermal impact and excellent blocking effects of gas and moisture.

For example, the curable organo polysiloxane composition including the compound (a) represented by Chemical Formula 1 may have excellent hardness compared with various organic resin substrates and may form a dense structure. Thus, the curable organo polysiloxane composition may exhibit low moisture and gas transmittance and excellent mechanical properties compared with other siloxane compositions. The curable organo polysiloxane composition may be used as an encapsulant sealing a light emitting device such as LED and the like, and herein, the low moisture and gas transmittance of the encapsulant may help reduce and/or prevent deterioration of optical characteristics of the LED when externally exposed for a long term. In addition, the compound (a) represented by Chemical Formula 1 may have a structure in which a phenyl group is substituted in a greater amount as compared to other hardeners. The encapsulant including the curable organo polysiloxane composition including the compound (a) represented by Chemical Formula 1 according to the embodiment may be suitable for forming a curing material having a high refractive index and high light transmittance.

The curable organo polysiloxane composition including the compound (a) represented by Chemical Formula 1 may have a dense structure and thus, high hardness and low gas transmittance and simultaneously, may increase adherence. In addition, when the compound (a) represented by Chemical Formula 1 is included, the curable organo polysiloxane composition may exhibit a low modulus at a high temperature and thus, a low coefficient of thermal expansion as well as maintain equivalent hardness to that of the other hardeners. Accordingly, the composition may exhibit less cracking or peeling off when cured at a high temperature and may exhibit improved thermal impact resistance at a high temperature.

As described above, the encapsulant may be a material protecting a LED chip and a phosphor from external air or moisture and a pollutant, e.g., a sulfur compound and the like. The encapsulant may exhibit characteristics of externally emitting light at various wavelengths. For example, when an optical part including a metal is exposed to the external pollutant, the external pollutant may be mostly permeated through an encapsulant and may corrode the metallic material, thus deteriorating luminance and light transmittance of the optical part. The encapsulant may exhibit physical hardness to primarily protect the optical part from an external impact and the like, and thus, the improved hardness and layer density may be related to blocking the encapsulant from the moisture and gas and additionally contributes to improving reliability (discoloring resistance and chemical resistance) as main properties of the encapsulant.

In some curable organo silicon encapsulants, the amount of an organo silicon composition having a T structure (a branch type) may be adjusted to help improve adherence and layer density. However, viscosity of the encapsulant may increase and may raise issues with processibility in terms of mixing and curing.

A hydrosilylated curable silicon encapsulant may additionally include organo silicon having a T structure to help increase hardness during the thermal curing process, and this hardness may be determined by the amount of the T structure. However, when the T structure organo silicon is simply included to a greater degree, the T structure organo silicon may increase a coefficient of thermal expansion (CTE). Thus, a plurality of cracks inside the encapsulant may occur, and hardness may improve, but overall the T structure may have a relatively small effect on blocking moisture and gas during the curing. Furthermore, the T structure organo silicon composition may have high viscosity and issues with processability (e.g., increasing a required process time and requiring a high pressure during the coating) may be experienced.

According to the embodiment, the curable organo polysiloxane composition may provide a resulting material having various hardnesses without changing the amount of the T structure organo silicon compound and simultaneously may help improve an effect of reducing moisture and gas permeability. In addition, other silicon-carbon repeating units along with the siloxane compound may be introduced to help improve mechanical properties of the encapsulant, due to a decreased modulus at a high temperature and thus, may help improve a thermal impact resistance at a high temperature.

In terms of reliability due to the aforementioned external pollutant, a composition applying excellent surface characteristics and low transmittance performance according to the embodiment may also exhibit discoloring resistance and chemical resistance of a transparent curable organo polysiloxane resin including a phenyl group. In addition, the embodiments may provide a curable organo polysiloxane composition in which an encapsulant is not discolored during a repetitive operation test under an exposure condition to the pollutant and luminance of a LED package is less deteriorated when the composition is used to manufacture an encapsulant.

The compound (a) represented by Chemical Formula 1 may include two or more silicon-bonded alkenyl groups (Si—Vi) and thus, may perform a hydrosilylation reaction with a first siloxane compound (b) having two or more silicon-bonded hydrogens (Si—H). In addition, the composition may include a second siloxane compound (c) including a silicon-bonded alkenyl group (Si—Vi) other than (e.g., different from) the compound (a) represented by Chemical Formula 1. Accordingly, the second siloxane compound (c) may also perform a hydrosilylation reaction with the first siloxane compound (b) including two or more silicon-bonded hydrogens (Si—H). Accordingly, the encapsulant composition may help protect a light emitting device from external moisture and gas. For example, the compound (a) represented by Chemical Formula 1 and the second siloxane compound (c) including silicon-bonded alkenyl group (Si—Vi) may form a dense polysiloxane structure with a larger molecular weight with the first siloxane compound (b) including a silicon-bonded hydrogen (Si—H).

The compound (a) represented by Chemical Formula 1 may have a number average molecular weight of less than about 4,000, e.g., less than or equal to about 3,000, less than or equal to about 2,000, less than or equal to about 1,500, less than or equal to about 1,000, less than or equal to about 900, less than or equal to about 800, less than or equal to about 700, less than or equal to about 600, or less than or equal to about 500.

The compound (a) represented by Chemical Formula 1 may perform a hydrosilylation reaction during the hydrosilylation reactions of the second siloxane compound (c) having a silicon-bonded alkenyl group (Si—Vi) and the first siloxane compound (b) having a silicon-bonded hydrogen (Si—H) in the composition. Thus, the compound (a) may tend to be uniformly distributed in the prepared organo polysiloxane polymer. Accordingly, a silicon-carbon bonding region in the compound (a) represented by Chemical Formula 1 may be uniformly distributed in the prepared organo polysiloxane polymer. As a result, the organo polysiloxane polymer may have high hardness during curing, and also a relatively low modulus at a high temperature.

In an exemplary embodiment, a number of a siloxane structural units, e.g., m in the compound (a) represented by Chemical Formula 1 may not be greater than about 5, e.g., may be greater than or equal to about 3 or an integer selected from about 0 to about 2.

In an implementation, the number of a structural unit marked as A in Chemical Formula 1 may not be greater than about 10, e.g., may be greater than or equal to about 5, greater than or equal to about 3, or about 1 to about 3 to have an appropriate number average molecular weight range within the range.

In an implementation, the A of Chemical Formula 1 may be selected from or include, e.g., a substituted or unsubstituted C1 to C10 alkylene group, a substituted or unsubstituted C6 to C20 cycloalkylene group, a substituted or unsubstituted C6 to C20 arylene group, or a combination thereof.

The compound (a) represented by Chemical Formula 1 may be prepared by a suitable method. For example, the compound (a) may be prepared by using halogenvinylsilane, dihalogensiloxane, and a dihalogenated carbon compound through a Grignard reaction.

In an implementation, the compound (a) of Chemical Formula 1 may be obtained through a nucleophilic substitution reaction of a compound having two carbon-carbon double bonds corresponding to the A in Chemical Formula 1 with a compound such as dichloroalkylsiloxane or dichloroarylsiloxane after hydrosilylating the compound having two carbon-carbon double bonds with a silane compound.

In an implementation, the compound (a) may be obtained through a nucleophilic substitution reaction of the compound having a moiety corresponding to the A between two silicons with a silane compound.

In an implementation, the at least one compound (a) of Chemical Formula 1 may include a compound represented by one of the following Chemical Formulae 2 to 4.

(Chemical Formula 2)

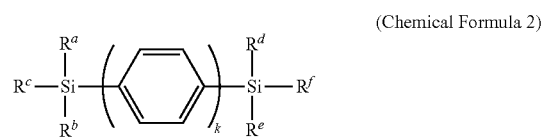

In Chemical Formula 2, $R^a$ to $R^f$ may each independently be selected from or include, e.g., hydrogen, a hydroxy group, a substituted or unsubstituted C1 to C10 alkyl group, a substituted or unsubstituted C2 to C12 alkenyl group, a substituted or unsubstituted C2 to C12 alkynyl group, a substituted or unsubstituted C1 to C10 alkoxy group, a substituted or unsubstituted C6 to C10 aryl group, a halogen, or a combination thereof.

In an implementation, at least one of $R^a$ to $R^c$ and at least one of $R^d$ to $R^f$ may each independently be a substituted or unsubstituted C2 to C12 alkenyl group. For example, at least one of $R^a$ to $R^c$ may be or include a substituted or unsubstituted C2 to C12 alkenyl group and at least one of $R^d$ to $R^f$ may be or include a substituted or unsubstituted C2 to C12 alkenyl group.

k may be an integer of 1 to 3.

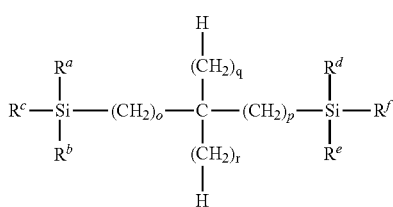

(Chemical Formula 3)

In Chemical Formula 3, $R^a$ to $R^f$ may each independently be selected from or include, e.g., hydrogen, a hydroxy group, a substituted or unsubstituted C1 to C10 alkyl group, a substituted or unsubstituted C2 to C12 alkenyl group, a substituted or unsubstituted C2 to C12 alkynyl group, a substituted or unsubstituted C1 to C10 alkoxy group, a substituted or unsubstituted C6 to C10 aryl group, a halogen, or a combination thereof.

In an implementation, at least one of $R^a$ to $R^c$ and at least one of $R^d$ to $R^f$ may each independently be or include a substituted or unsubstituted C2 to C12 alkenyl group. For example, at least one of $R^a$ to $R^c$ may be or include a substituted or unsubstituted C2 to C12 alkenyl group and at least one of $R^d$ to $R^f$ may be or include a substituted or unsubstituted C2 to C12 alkenyl group.

o and p may each independently be an integer of 1 to 5, and q and r may each independently be an integer of 0 to 5.

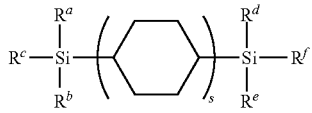

(Chemical Formula 4)

In Chemical Formula 4, $R^a$ to $R^f$ may each independently be selected from or include, e.g., hydrogen, a hydroxy group, a substituted or unsubstituted C1 to C10 alkyl group, a substituted or unsubstituted C2 to C12 alkenyl group, a substituted or unsubstituted C2 to C12 alkynyl group, a substituted or unsubstituted C1 to C10 alkoxy group, a substituted or unsubstituted C6 to C10 aryl group, a halogen, or a combination thereof.

In an implementation, at least one of $R^a$ to $R^c$ and at least one of $R^d$ to $R^f$ are each independently a substituted or unsubstituted C2 to C12 alkenyl group. For example, at least one of $R^a$ to $R^c$ may be or include a substituted or unsubstituted C2 to C12 alkenyl group and at least one of $R^d$ to $R^f$ may be or include a substituted or unsubstituted C2 to C12 alkenyl group.

s may be an integer of 1 to 3.

The compounds represented by Chemical Formulae 2 to 4 may be prepared according to a suitable method, e.g., a Grignard reaction method or the like.

The compound (a) represented by Chemical Formula 1 may be included in the composition in an amount of about 0.1 wt % to about 20 wt %, e.g., about 0.1 wt % to about 15 wt %, about 0.1 wt % to about 10 wt %, about 0.1 wt % to about 8 wt %, about 0.1 wt % to 5 wt %, about 0.1 wt % to about 3 wt %, or about 0.1 wt % to about 2 wt %, based on a total weight of the composition.

The first siloxane compound (b) including a silicon-bonded hydrogen (Si—H) may include a compound represented by the following Chemical Formula 5.

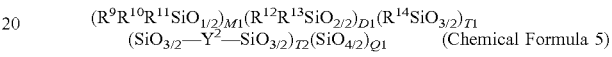

(Chemical Formula 5)

In Chemical Formula 5, $R^9$ to $R^{14}$ may each independently be selected from or include, e.g., a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a substituted or unsubstituted C1 to C30 acyl group, a hydroxy group, a halogen, or a combination thereof.

In an implementation, two or more of $R^9$ to $R^{14}$ may be hydrogen.

$Y^1$ may be selected from or include, e.g., a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

$0<M1<1$, $0 \le D1<1$, $0 \le T1<1$, $0 \le T2<1$, $0 \le Q1<1$, and $M1+D1+T1+T2+Q1=1$.

The first siloxane compound having a silicon-bonded hydrogen (Si—H) represented by Chemical Formula 5 may perform a hydrosilylation reaction with the second siloxane compound (c) having a silicon-bonded alkenyl group (Si—Vi).

The first siloxane compound represented by Chemical Formula 5 may be, e.g., obtained by hydrolysis and condensation polymerization of a monomer represented by $R^9R^{10}R^{11}SiZ^1$ with at least one selected from: a monomer represented by $R^{12}R^{13}SiZ^2Z^3$, a monomer represented by $R^{14}SiZ^4Z^5Z^6$, a monomer represented by $Z^7Z^8Z^9Si-Y^1-SiZ^{10}Z^{11}Z^{12}$, and a monomer represented by $SiZ^{13}Z^{14}Z^{15}Z^{16}$. Herein, $R^9$ to $R^{14}$ are the same as defined above, and $Z^1$ to $Z^{16}$ may each independently be a C1 to C6 alkoxy group, a hydroxy group, a halogen, a carboxyl group, or a combination thereof.

In an implementation, at least one of the $R^9$ to $R^{14}$ may include a substituted or unsubstituted C6 to C30 aryl group. Accordingly, optical properties may be secured by increasing a refractive index of an encapsulant including the siloxane compound.

The first siloxane compound including silicon-bonded hydrogen (Si—H), e.g., represented by Chemical Formula 5, may be used alone or as a mixture of two or more thereof.

In an implementation, the first siloxane compound represented by Chemical Formula 5 may be a siloxane compound in which T1, T2, and Q1 are 0.

The first siloxane compound (b) including a silicon-bonded hydrogen (Si—H) may be included in the composition in an amount of about 10 wt % to about 49 wt %, e.g., about 15 wt % to about 40 wt %, about 15 wt % to about 30 wt %, or about 20 wt % to about 25 wt % based on the total weight of the composition.

The second siloxane compound (c) including a silicon-bonded alkenyl group (Si—Vi) may include a compound represented by the following Chemical Formula 6.

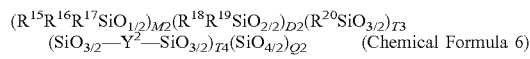
   (Chemical Formula 6)

In Chemical Formula 6, $R^{15}$ to $R^{20}$ may each independently be selected from or include, e.g., hydrogen, a substituted or unsubstituted C1 to C20 alkyl group, a substituted or unsubstituted C7 to C20 arylalkyl group, a substituted or unsubstituted C1 to C20 heteroalkyl group, a substituted or unsubstituted C3 to C20 cycloalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C6 to C20 aryl group, a substituted or unsubstituted C1 to C10 alkoxy group, a substituted or unsubstituted C1 to C30 acyl group, a hydroxy group, a halogen, or a combination thereof.

In an implementation, two or more of $R^{15}$ to $R^{20}$ may be or may include, e.g., a substituted or unsubstituted C2 to C20 alkenyl group.

$Y^2$ may be selected from or include, e.g., a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

0<M2<1, 0≤D2<1, 0≤T3<1, 0≤T4<1, 0≤Q2<1, and M2+D2+T3+T4+Q2=1.

The second siloxane compound including a silicon-bonded alkenyl group (Si—Vi) represented by Chemical Formula 6 may perform a hydrosilylation reaction with the first siloxane compound (b) including a silicon-bonded hydrogen (Si—H).

As shown by Chemical Formula 6, the second siloxane compound may include a siloxane structural unit having a T structure (0<T3<1). For example, the composition according to an embodiment may include a compound having a silicon-bonded alkenyl group (Si—Vi) and including a T structure siloxane structural unit. Thus, the composition may maintain an equivalent dense structure to that of an encapsulant composition including a T structure siloxane and also, high physical hardness. In this way, the composition according to the embodiment may include a T structure siloxane compound and a compound represented by Chemical Formula 1, and thus may have a low coefficient of thermal expansion and a low modulus at a high temperature.

In an exemplary embodiment, the D2, T4, and Q2 in Chemical Formula 6 may be all 0.

The second siloxane compound represented by Chemical Formula 6 may be, e.g., obtained by hydrolysis and condensation polymerization of a monomer represented by $R^{15}R^{16}R^{17}SiZ^{17}$ with at least one selected from: a monomer represented by $R^{18}R^{19}SiZ^{18}Z^{19}$, a monomer represented by $R^{20}SiZ^{20}Z^{21}Z^{22}$, a monomer represented by $Z^{23}Z^{24}Z^{25}Si—Y^2—SiZ^{26}Z^{27}Z^{28}$, and a monomer represented by $SiZ^{29}Z^{30}Z^{31}Z^{32}$. Herein, $R^{15}$ to $R^{20}$ are the same as defined above, and $Z^{17}$ to $Z^{32}$ are independently a C1 to C6 alkoxy group, a hydroxy group, a halogen, a carboxyl group, or a combination thereof.

In an implementation, at least one of the $R^{15}$ to $R^{20}$ may include a substituted or unsubstituted C6 to C30 aryl group. Accordingly, optical properties may be secured by increasing an refractive index of an encapsulant including the siloxane compound.

The second siloxane compound including the silicon-bonded alkenyl group (Si—Vi), e.g., represented by Chemical Formula 6, may be used alone or as a mixture of two or more thereof.

The second siloxane compound (c) including a silicon-bonded alkenyl group (Si—Vi) may be included in the composition in an amount of about 50 wt % to about 89 wt %, e.g., about 60 wt % to about 80 wt % or about 70 wt % to about 75 wt %, based on the total weight of the composition.

For example, the second siloxane compound, e.g., represented by Chemical Formula 6, marked as the T structure siloxane, may be included in the most amount as a main compound forming a siloxane structure in the composition according to the embodiment and may form an organo polysiloxane polymer having a dense structure with the first siloxane compound, e.g., represented by Chemical Formula 5, and including a silicon-bonded hydrogen (Si—H) through a hydrosilylation reaction. Herein, the compound (a) represented by Chemical Formula 1 may undergo a hydrosilylation reaction with the first siloxane compound (b) including a silicon-bonded hydrogen (Si—H) and may be dispersed and bonded among polymers prepared from the first and second siloxane compounds, e.g., represented by Chemical Formulae 5 and 6. Accordingly, the composition may form an organo polysiloxane polymer capable of maintaining equivalent physical hardness and showing a low modulus at a high temperature and a low coefficient of thermal expansion and thus, improved mechanical properties and high temperature characteristics compared with a conventional organo polysiloxane polymer including only a T structure siloxane compound.

In an implementation, the second siloxane compound (c) including a silicon-bonded alkenyl group (Si—Vi) may further include a compound represented by Chemical Formula 7.

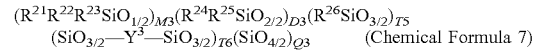
   (Chemical Formula 7)

In Chemical Formula 7, $R^{21}$ to $R^{26}$ may each independently be selected from or include, e.g., hydrogen, a substituted or unsubstituted C1 to C20 alkyl group, a substituted or unsubstituted C7 to C20 arylalkyl group, a substituted or unsubstituted C1 to C20 heteroalkyl group, a substituted or unsubstituted C3 to C20 cycloalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C6 to C20 aryl group, a substituted or unsubstituted C1 to C10 alkoxy group, a substituted or unsubstituted C1 to C30 acyl group, a hydroxy group, a halogen, or a combination thereof.

In an implementation, two or more of $R^{21}$ to $R^{26}$ may be or may include a substituted or unsubstituted C2 to C20 alkenyl group.

$Y^3$ may be selected from or include, e.g., a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

$0<M3<1$, $0<D3<1$, $0\leq T5<1$, $0\leq T6<1$, $0\leq Q3<1$, and $M3+D3+T5+T6+Q3=1$.

As shown above, the compound represented by Chemical Formula 7 as a second siloxane compound including a silicon-bonded alkenyl group (Si—Vi) may undergo a hydrosilylation reaction with the first siloxane compound (b) having a silicon-bonded hydrogen (Si—H).

In Chemical Formula 7, T5, T6, and Q3 may be all 0, and herein, the compound of Chemical Formula 7 may have a D structure, e.g., may be a linear siloxane compound.

The compound represented by Chemical Formula 7 may be, e.g., obtained by hydrolysis and condensation polymerization of a monomer represented by $R^{21}R^{22}R^{23}SiZ^{33}$ with at least one selected from: a monomer represented by $R^{24}R^{25}SiZ^{34}Z^{35}$, a monomer represented by $R^{26}SiZ^{36}Z^{37}Z^{38}$, a monomer represented by $Z^{39}Z^{40}Z^{41}Si-Y^3-SiZ^{42}Z^{43}Z^{44}$, and a monomer represented by $SiZ^{45}Z^{46}Z^{47}Z^{48}$. Herein, $R^{21}$ to $R^{26}$ are the same as defined above, and $Z^{33}$ to $Z^{48}$ are independently a C1 to C6 alkoxy group, a hydroxy group, a halogen, a carboxyl group, or a combination thereof.

In an implementation, at least one of $R^{21}$ to $R^{26}$ may include a substituted or unsubstituted C6 to C30 aryl group. Accordingly, optical properties may be secured by increasing a refractive index of an encapsulant including the siloxane compound.

The second siloxane compound including a silicon-bonded alkenyl group (Si—Vi), e.g., represented by Chemical Formula 7 may be used alone or as a mixture of two or more thereof.

The compound represented by Chemical Formula 7 may be included in the composition in an amount of about 0.1 wt % to about 20 wt %, e.g., about 0.1 wt % to about 15 wt %, about 0.1 wt % to about 10 wt %, about 1 wt % to about 10 wt %, or about 1 wt % to about 5 wt %, based on the total weight of the composition.

The second siloxane compound (c) having a silicon-bonded alkenyl group (Si—Vi) and the first siloxane compound (b) having silicon-bonded hydrogen (Si—H) (other than or different from the compound (a) represented by Chemical Formula 1) may each independently have a weight average molecular weight of about 200 g/mol to about 30,000 g/mol.

In an implementation, the composition may further include a filler.

The filler may be, e.g., made of inorganic oxide. For example, the filler may include silica, alumina, titanium oxide, zinc oxide, or a combination thereof.

In an implementation, the composition may further include a hydrosilylation catalyst.

The hydrosilylation catalyst may help promote the hydrosilylation reaction of the compound represented by Chemical Formula 1 and the first siloxane compound having a silicon-bonded hydrogen (Si—H) and of the second siloxane compound having silicon-bonded alkenyl group (Si—Vi) and the first siloxane compound having a silicon-bonded hydrogen (Si—H). The hydrosilylation catalyst may include, e.g., platinum, rhodium, palladium, ruthenium, iridium, or a combination thereof.

The hydrosilylation catalyst may be included in the composition in an amount of about 0.1 ppm to 1,000 ppm, based on a total amount of the encapsulant composition.

The composition may be heat-treated and cured at a predetermined temperature and thus, may be used as an encapsulant. The encapsulant may be applied to, e.g., an electronic device such as a light emitting diode and an organic light emitting diode device.

Hereinafter, a light emitting diode as one example of an electronic device manufactured by applying an encapsulant according to one embodiment is illustrated referring to FIG. 1.

FIG. 1 illustrates a schematic cross-sectional view of a light emitting diode according to one embodiment.

Referring to FIG. 1, the light emitting diode may include, e.g., a mold 110; a lead frame 120 inside the mold 110; a light emitting diode chip 140 mounted on the lead frame 120; a bonding wire 150 connecting the lead frame 120 to the light emitting diode chip 140; and an encapsulant 200 covering the light emitting diode chip 140.

The encapsulant 200 may be obtained by curing the encapsulant composition. The encapsulant 200 may be formed from the composition, and thus may help effectively protect the light emitting diode chip 140 and may help prevent the performance of the light emitting diode from being deteriorated.

In an implementation, a phosphor 190 may be dispersed in the encapsulant 200. The phosphor 190 may include a material excited by light and emitting light within its intrinsic wavelength range and may largely include a quantum dot such as a semiconductor nanocrystal. The phosphor 190 may include, e.g., a mixture of two or more selected from blue phosphor, green phosphor, or red phosphor.

The phosphor 190 may display a color in a predetermined wavelength region by light supplied from the light emitting diode chip 140 as a light emission part, and herein, the light emitting diode chip 140 may display a color in a shorter wavelength region than the color displayed by the phosphor 190. For example, when the phosphor 190 displays red, the light emitting diode chip 140 may display blue or green having a shorter wavelength region than the red.

In an implementation, the color emitted from the light emitting diode chip 140 may be combined with the color emitted from the phosphor 190, and thus display white. For example, when the light emitting diode chip 140 supplies blue light and the phosphor 190 includes a red phosphor and a green phosphor, the electronic device may combine blue, red, and green to display white.

In an implementation, the phosphor 190 may be omitted.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis Examples 1 to 3: Synthesis of Siloxane Compound

Synthesis Example 1: Synthesis of Organo Hydrogensiloxane Compound

One kg of a mixed solvent obtained by mixing water and toluene in a weight ratio of 5:5 was put in a 3-necked flask, and a monomer mixture of dimethyl chlorosilane and diphenyldichlorosilane in a mole ratio of 33:67 was added thereto in a dropwise fashion over 2 hours, while the flask was maintained at 23° C. When the addition was complete, the obtained mixture was heated and refluxed at 90° C. for 3 hours to perform a condensation polymerization reaction. Then, the resultant was cooled down to ambient temperature, and an aqueous layer was removed therefrom, preparing a polymer solution dissolved in toluene. The obtained polymer solution was washed with water to remove a reaction byproduct of chlorine. Subsequently, the neutral polymer solution was distilled under a reduced pressure to remove the toluene, obtaining a siloxane compound represented by Chemical Formula 5a.

$(HMe_2SiO_{1/2})_{0.33}(Ph_2SiO_{2/2})_{0.67}$ (Chemical Formula 5a)

Synthesis Example 2: Synthesis of Organo Vinyl Siloxane Compound Having T Structure One kg of a mixed solvent obtained by mixing water and toluene in a weight ratio of 5:5 was put in a 3-necked flask, and a monomer mixture of vinyldimethylchlorosilane and phenyltrichlorosilane in a mole ratio of 32.2:67.8 was added thereto in a drop wise fashion over 2 hours, while the flask was maintained at 23° C. When the addition was complete, the resulting mixture was heated and refluxed at 90° C. for 3 hours to perform a condensation polymerization reaction. Subsequently, the resultant was cooled down to ambient temperature, and an aqueous layer was removed therefrom, obtaining a polymer solution dissolved in toluene. The obtained polymer solution was washed with water to remove a reaction byproduct of chlorine. Subsequently, the neutral polymer solution was distilled under a reduced pressure to remove the toluene, obtaining a siloxane compound represented by Chemical Formula 6a.

$(Me_2ViSiO_{1/2})_{0.322}(PhSiO_{3/2})_{0.678}$ (Chemical Formula 6a)

Synthesis Example 3: Synthesis of Organo Vinyl Siloxane Compound Having D Structure One kg of a mixed solvent obtained by mixing water and toluene in a weight ratio of 5:5 was put in a 3-necked flask, and a monomer mixture of vinyldimethylchlorosilane and phenylmethyldichlorosilane in a mole ratio of 20.6:79.4 was added thereto in a dropwise fashion over 2 hours, while the flask was maintained at 23° C. When the addition was complete, the resulting mixture was heated and refluxed at 90° C. for 3 hours to perform a condensation polymerization reaction. Subsequently, the resultant was cooled down to ambient temperature, and an aqueous layer was removed therefrom, obtaining a polymer solution dissolved in toluene. The obtained polymer solution was washed with water to remove a reaction byproduct of chlorine. Subsequently, the neutral polymer solution was distilled under a reduced pressure to remove the toluene, obtaining a siloxane compound represented by Chemical Formula 7a.

$(Me_2ViSiO_{1/2})_{0.206}(PhMeSiO_{2/2})_{0.794}$ (Chemical Formula 7a)

Synthesis Example 4 to 7: Synthesis of Silicon Compound

Synthesis Example 4: Synthesis of 1,4-bis(dimethyl(vinyl)silyl)benzene (Chemical Formula 8 Compound)

Magnesium powder (0.73 g, 30 mmol), iodine crystals (1 mg), and anhydrous tetrahydrofuran (100 ml) were put in a 500 ml 3-necked flask equipped with a reaction agitator, a thermometer, a reflux-cooler, and a rubber septum under a nitrogen atmosphere and agitated at ambient temperature for about 20 minutes. Then, 50 ml of anhydrous tetrahydrofuran in which 1,4-dibromobenzene (4.81 g, 20 mmol) was dissolved was added thereto over about 20 minutes, while the flask was agitated. The reaction initiation was confirmed through reflux of the tetrahydrofuran and discoloring of iodine in the solution. The mixture was fervently agitated for one hour, while the reaction solution was maintained at about 60° C. After the agitation, 50 ml of anhydrous tetrahydrofuran in which chlorodimethyl(vinyl)silane (2.64 g, 22 mmol) was dissolved was added to the reaction solution in a dropwise manner, while the reaction solution was maintained at about 5° C. by using an ice water bath. Then, the reaction solution was fervently agitated for about 2 hours while maintained at about 60° C. After the agitation, the tetrahydrofuran was removed by using a rotary concentrator. The concentrated product was diluted by anhydrous hexane, filtered, and reconcentrated by using the rotary concentrator. The unpurified product was purified through silica column chromatography, obtaining 1,4-bis(dimethyl(vinyl)silyl)benzene represented by Chemical Formula 8.

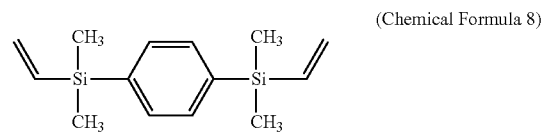 [SMILES: C=C[Si](C)(C)c1ccc([Si](C)(C)C=C)cc1]

(Chemical Formula 8)

Synthesis Example 5: Synthesis of 1,4-bis(dimethyl(vinyl)silyl)butane) (Compound of Chemical Formula 9)

1,4-bis(dimethyl(vinyl)silyl) butane represented by Chemical Formula 9 was obtained according to the same method as Synthesis Example 4 except for using 1,4-dibromobutane (4.27 g, 20 mmol) instead of the 1,4-dibromobenzene (4.81 g, 20 mmol).

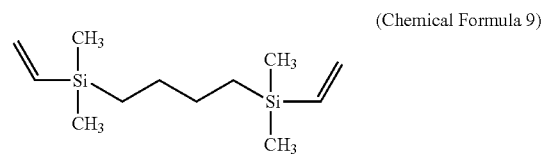

(Chemical Formula 9)

Synthesis Example 6: Synthesis of 1,4-bis(dimethyl(silyl)cyclohexane (Compound of Chemical Formula 10)

1,4-bis(dimethyl(silyl)cyclohexane represented by Chemical Formula 10 was obtained according to the same method as Synthesis Example 4 except for using 1,4-dibromocyclohexane (4.79 g, 20 mmol) instead of the 1,4-dibromobenzene (4.81 g, 20 mmol).

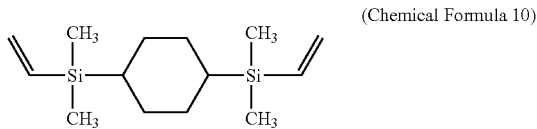 [SMILES: C=C[Si](C)(C)C1CCC([Si](C)(C)C=C)CC1]

(Chemical Formula 10)

Synthesis Example 7: Synthesis of 1,5-bis(dimethyl(vinyl)silyl)pentane (Compound of Chemical Formula 11)

1,5-bis(dimethyl(vinyl)silyl)pentane represented by Chemical Formula 11 was obtained according to the same method as Synthesis Example 4 except for using 1,5-dibromopentane (4.55 g, 20 mmol) instead of the 1,4-dibromobenzene (4.81 g, 20 mmol).

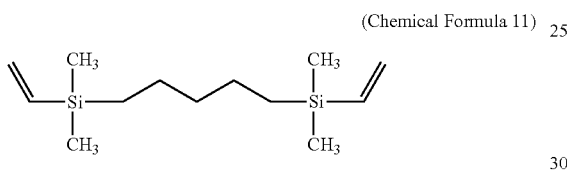

(Chemical Formula 11)

Examples 1 to 4 and Comparatives Example 1: Preparation of Encapsulant Composition The organo hydrogen siloxane compound (Chemical Formula 5a) according to Synthesis Example 1, organo vinyl siloxane compound (Chemical Formula 6a) having a T structure according to Synthesis Example 2, and the compounds having Chemical Formulae 8 to 11 according to Synthesis Examples 4 to 7 or the organo vinyl siloxane compound having a D structure (Chemical Formula 7a) according to Synthesis Example 3 were mixed in a weight ratio provided in the following Table 1. Then, 5 wt % of glycidoxy functionalized polysiloxane as an adhesion agent based on the total weight of each mixture was added to the mixture, a hydrosilylation catalyst, Pt-CS 2.0 (Umicore) was added thereto to be 5 ppm based on the total weight of each mixture, and the mixture was respectively subjected to a vacuum and foam-removal, preparing each encapsulant composition according to Examples 1 to 4 and Comparative Example 1 as shown in the following Table 1.

After measuring viscosity and refractive index of the encapsulant composition in the following method, each composition was manufactured into an encapsulant by being cured at 120° C. for 30 minutes and at 170° C. for 1 hour, and hardness (Shore D), modulus (@125° C. MPa), thermal impact characteristics, moisture permeability, oxygen transmittance and yellowing reliability of each encapsulant were respectively measured in the following method, and the results are provided in the following Table 1.

Viscosity: measured by using a Brookfield (DV-II+pro) spindle No. 52 with a reference to viscosity at 25° C. under Torque of 90%.

Refractive Index: measured by using a liquid mixture before curing with an Abbe refractive index under a wavelength of D-line 589 nm.

Hardness: measured by putting each polysiloxane composition according to Examples 1 to 4 and Comparative Example 1 into a mold coated with Teflon (2.5 cm (width)×7.5 cm (length)×1 cm (thickness)), thermally curing it at 150° C. for 2 hours, cooling it down to room temperature and then, using a Shore D hardness meter.

Modulus: obtained by putting each polysiloxane composition according to Examples 1 to 4 and Comparative Example 1 in a Teflon-coated mold (35 mm (width)×10 mm (length)×4 mm (thickness)), thermally curing it at 150° C. for 2 hours, cooling it down to ambient temperature and recording an elastic modulus (a storage modulus) at 125° C. with a DMA (Dynamic Mechanical Analysis) equipment, while a temperature was increased from −50° C. to 150° C. at a speed of 2° C./min.

Thermal Impact Test: a package sample was manufactured by putting each polysiloxane composition according to Examples 1 to 4 and Comparative Example 1 into LED PKG (5630 PKG, Samsung Electronics Co., Ltd.) and a YAG phosphor, curing them at 150° C. for 2 hours and cooling them down to ambient temperature. Subsequently, the number of working packages was counted by checking whether the packages worked or not after exposing them under the following conditions for a corresponding time as one cycle and repeating the cycle 500 times.

(i) Condition: each package was exposed to low and high temperatures and moved back and forth between two chambers, while the two chambers were respectively maintained at −45° C. and 125° C. −45° C. (maintained for 30 minutes) ⇆125° C. (maintained for 30 minutes).

(ii) Adherence: measured in the following method.

After inserting a polytetrafluoroethylene spacer (a width of 10 mm, a length of 20 mm, a thickness of 1 mm) between two sheets of silver specimens (a width of 25 mm, a length of 50 mm, a thickness of 1 mm), each polysiloxane composition according to Examples 1 to 4 and Comparative Example 1 was charged into a space left between the silver specimens, and the silver specimens were fixed with a clip. Subsequently, the silver specimens were allowed to stand in a 150° C. oven for 2 hours to cure the composition. Then, the composition was cooled down to ambient temperature, and then, a stress at a moment that the silver specimen was torn apart was measured by removing the clip and the spacer, putting the silver specimen in a tensile tester (3367, Instron), and pulling it toward an opposite horizontal direction.

Moisture Permeability and Oxygen Transmittance: measured by manufacturing an encapsulant into a film with a frame at 130° C./5 min and 170° C./4 hours and using moisture permeability (ASTM F-1249)/oxygen transmittance (ASTM D-3985) equipments made by MOCON Inc.

Yellowing Reliability: measured in the following method.

(i) The mixtures for an encapsulant were respectively measured and mixed with a phosphor in a beaker, and the mixture was subjected to foam-removal.

(ii) The mixed resin and the phosphor were coated in a LED package.

(iii) The coated package was thermally cured in a curing oven. (150° C.×2 hr)

(iv) Initial luminance of the package was measured after cooling the package down to ambient temperature when the curing was complete.

(v) After putting a sulfur mixture consisting of 0.7 g of $K_2S$ and 50 g of $H_2O$ in a 250 ml glass bottle, the assembled package was hung high enough not to contact the sulfur mixture.

(vi) The glass bottle having the package and the sulfur was put in a 50° C. water double boiler. Sulfur permeability was evaluated by measuring every five packages at the initial 0 hour and 8 hours and averaged.

(vii) The final result was calculated as a decrease ratio of the luminance after 8 hours relative to the initial luminance.

TABLE 1

|  | Example 1 | Example 2 | Example 3 | Example 4 | Comparative Example 1 |
|---|---|---|---|---|---|
| Organovinyl siloxane (T structure) | 70 | 70 | 70 | 70 | 70 |
| Organohydrogen siloxane | 23 | 23 | 23 | 23 | 23 |
| Organovinyl silicon | 2 [Chemical Formula 8] | 2 [Chemical Formula 9] | 2 [Chemical Formula 10] | 2 [Chemical Formula 11] | 2 [Synthesis Example 3] |
| Adhesion agent | 5 | 5 | 5 | 5 | 5 |
| Catalyst (ppm) | 5 | 5 | 5 | 5 | 5 |
| Appearance | transparent | transparent | transparent | transparent | transparent |
| Viscosity (cP) | 3005 | 3376 | 3646 | 3885 | 3670 |
| Curing condition | 120° C./30 min → 170° C./1 hour | | | | |
| Refractive index | 1.54 | 1.54 | 1.54 | 1.54 | 1.54 |
| Hardness (Shore D) | 65 | 65 | 65 | 65 | 65 |
| Modulus (@125° C. MPa) | 3.3 | 2.7 | 3.6 | 2.8 | 6.2 |
| Thermal impact test (the number of working packages after 500 cycles) | 100/100 | 100/100 | 100/100 | 100/100 | 65/100 |
| moisture permeability (gm/m² day) | 5.0 | 5.4 | 4.8 | 5.3 | 6.5 |
| Oxygen transmittance (cc/m² day) | 293 | 333 | 284 | 322 | 393 |
| Yellowing reliability (%) | 91.1 | 88.2 | 93.6 | 88.9 | 76.6 |

(each component was used in a unit of wt %)

As shown in Table 1, the compositions according to Examples 1 to 4 (including the compounds represented by Chemical Formulae 8 to 11) showed that a cured material had hardness (shore D), a modulus and viscosity changed depending on the structures of the compounds represented by Chemical Formulae 8 to 11. On the other hand, the composition including the D structure organo siloxane (Synthesis Example 3) and the T structure siloxane compound (Synthesis Example 2) according to Comparative Example 1 showed higher modulus and thus, a higher inferiority rate in a thermal impact test than the ones according to Examples 1 to 4. These improved hardness and mechanical properties reduced moisture and oxygen transmittance as well as external appearance and had an effect on decreasing inflow of external pollutants into an encapsulant after the curing.

By way of summation and review, a light emitting device may include an encapsulant having a packaging or encapsulation structure. The encapsulant may protect the light emitting device from external gas and moisture and may externally transmit light at various wavelengths emitted from the light emitting device. The encapsulant may effectively block gases and moisture and may help prevent discoloring.

As mentioned above, a curable organo polysiloxane composition according to one embodiment may exhibit excellent hardness and mechanical properties, may have an effect on reducing moisture and oxygen transmittance and thus, may be used as an adhesion agent, a binder, a protection coating material, an underfiller and the like for an electronic device, an electron part, an electrical device, an electrical part, and the like. For example, a curing material having the composition may have a high refractive index and high light transmittance and thus, may be used for an optical semiconductor and a sealer, an adhesive, a binder, a coating material, an underfiller and the like for other parts for the optical semiconductor. In an implementation, the composition according to an embodiment may be appropriately used as an encapsulant for a LED display and the like.

The embodiments may provide a curable organo polysiloxane composition having high temperature characteristics, improved mechanical properties and heat resistance, and gas and moisture blocking properties.

For example, the curable organo polysiloxane composition according to the embodiment may provide an encapsulant having improved mechanical properties, heat resistance and high temperature characteristics, and improved gas and moisture blocking properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made

DESCRIPTION OF SYMBOLS

110: mold
140: light emitting diode chip
200: encapsulant
120: frame
150: bonding wire

What is claimed is:
1. A curable organo polysiloxane composition, comprising:
   at least one compound represented by the following Chemical Formula 1 and having a number average molecular weight of less than about 4,000,
   at least one first siloxane compound including a silicon-bonded hydrogen; and
   at least one second siloxane compound including a silicon-bonded alkenyl group:

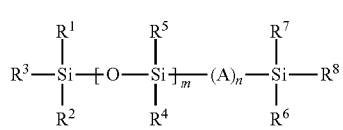

(Chemical Formula 1)

wherein, in Chemical Formula 1,
A is selected from a substituted or unsubstituted C1 to C21 alkylene group, a substituted or unsubstituted C3 to C12 cycloalkylene group, a substituted or unsubstituted C6 to C30 heterocycloalkylene group, a substituted or unsubstituted C2 to C20 alkenylene group, a substituted or unsubstituted C2 to C20 alkynylene group, a substituted or unsubstituted C6 to C30 arylene group, a substituted or unsubstituted C2 to C30 heteroarylene group, or a combination thereof,
$R^1$ to $R^8$ are each independently selected from hydrogen, a substituted or unsubstituted C1 to C21 alkyl group, a substituted or unsubstituted C7 to C20 arylalkyl group, a substituted or unsubstituted C1 to C20 heteroalkyl group, a substituted or unsubstituted C3 to C12 cycloalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C1 to C10 alkoxy group, a substituted or unsubstituted C1 to C30 acyl group, a hydroxy group, a halogen, or a combination thereof, two or more of $R^1$ to $R^8$ being a substituted or unsubstituted C2 to C20 alkenyl group,
m is an integer of 0 to 5, and
n is an integer of 1 to 10,
wherein the at least one first siloxane compound includes a compound represented by the following Chemical Formula 5:

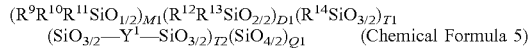

(Chemical Formula 5)

wherein, in Chemical Formula 5,
$R^9$ to $R^{14}$ are each independently selected from a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a substituted or unsubstituted C1 to C30 acyl group, a hydroxy group, a halogen, or a combination thereof, two or more of $R^9$ to $R^{14}$ being hydrogen,
$Y^1$ is selected from a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof,
$0<M1<1$, $0\le D1<1$, $0\le T1<1$, $0\le T2<1$, $0\le Q1<1$, and $M1+D1+T1+T2+Q1=1$;
wherein the at least one second siloxane compound includes a compound represented by the following Chemical Formula 6:

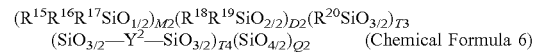

(Chemical Formula 6)

wherein, in Chemical Formula 6,
$R^{15}$ to $R^{20}$ are each independently selected from hydrogen, a substituted or unsubstituted C1 to C20 alkyl group, a substituted or unsubstituted C7 to C20 arylalkyl group, a substituted or unsubstituted C1 to C20 heteroalkyl group, a substituted or unsubstituted C3 to C20 cycloalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C6 to C20 aryl group, a substituted or unsubstituted C1 to C10 alkoxy group, a substituted or unsubstituted C1 to C30 acyl group, a hydroxy group, a halogen, or a combination thereof, two or more of $R^{15}$ to $R^{20}$ being a substituted or unsubstituted C2 to C20 alkenyl group,
$Y^2$ is selected from a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof,
$0<M2<1$, $0\le D2<1$, $0<T3<1$, $0\le T4<1$, $0\le Q2<1$, and $M2+D2+T3+T4+Q2=1$.

2. The curable organo polysiloxane composition as claimed in claim 1, wherein A is selected from a substituted or unsubstituted C1 to C10 alkylene group, a substituted or unsubstituted C3 to C12 cycloalkylene group, a substituted or unsubstituted C6 to C20 arylene group, or a combination thereof.

3. The curable organo polysiloxane composition as claimed in claim 1, wherein the at least one compound represented by Chemical Formula 1 includes a compound represented by one of the following Chemical Formula 2 to Chemical Formula 4:

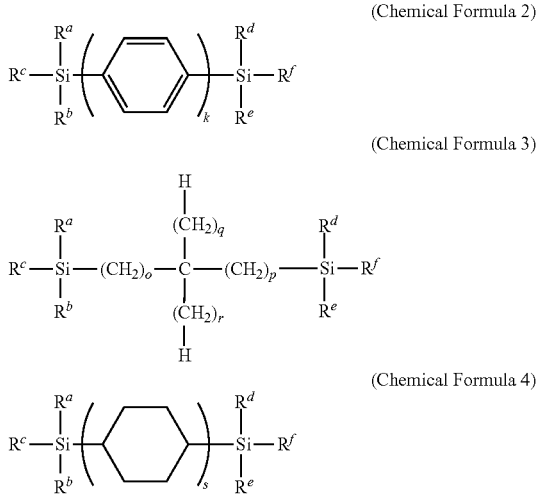

(Chemical Formula 2)

(Chemical Formula 3)

(Chemical Formula 4)

wherein, in Chemical Formulae 2 to 4,
$R^a$ to $R^f$ are each independently selected from hydrogen, a hydroxy group, a substituted or unsubstituted C1 to C10 alkyl group, a substituted or unsubstituted C2 to C12 alkenyl group, a substituted or unsubstituted C2 to C12 alkynyl group, a substituted or unsubstituted C1 to C10 alkoxy group, a substituted or unsubstituted C6 to C10 aryl group, a halogen, or a combination thereof,
at least one of $R^a$ to $R^c$ is a substituted or unsubstituted C2 to C12 alkenyl group,
at least one of $R^d$ to $R^f$ is a substituted or unsubstituted C2 to C12 alkenyl group,
k is an integer of 1 to 3,
o and p are each independently an integer of 1 to 5,
q and r are each independently an integer of 0 to 5, and
s is an integer of 1 to 3.

4. The curable organo polysiloxane composition as claimed in claim 1, wherein the at least one compound represented by Chemical Formula 1 includes a compound represented by one of the following Chemical Formula 8 to Chemical Formula 11:

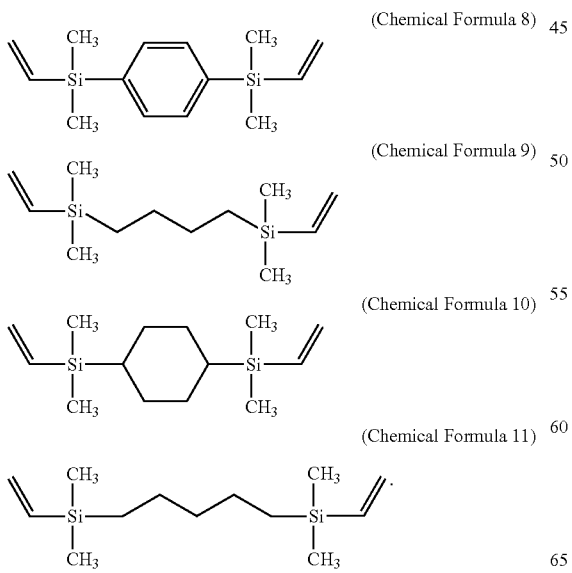

(Chemical Formula 8)

(Chemical Formula 9)

(Chemical Formula 10)

(Chemical Formula 11)

5. The curable organo polysiloxane composition as claimed in claim 1, wherein m is an integer of 0 to 2.

6. The curable organo polysiloxane composition as claimed in claim 1, wherein n is an integer of 1 to 3.

7. The curable organo polysiloxane composition as claimed in claim 1, wherein the at least one compound represented by Chemical Formula 1 is included in the composition in an amount of about 0.1 wt % to about 20 wt %, based on a total weight of the composition.

8. The curable organo polysiloxane composition as claimed in claim 1, wherein at least one of $R^9$ to $R^{14}$ of Chemical Formula 5 is a substituted or unsubstituted C6 to C20 aryl group.

9. The curable organo polysiloxane composition as claimed in claim 1, wherein the at least one first siloxane compound is included in the composition in an amount of about 10 wt % to about 49 wt %, based on a total weight of the composition.

10. The curable organo polysiloxane composition as claimed in claim 1, wherein the at least one second siloxane compound further includes a compound represented by the following Chemical Formula 7:

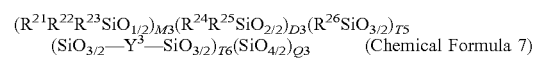

(Chemical Formula 7)

wherein, in Chemical Formula 7,
$R^{21}$ to $R^{26}$ are each independently selected from hydrogen, a substituted or unsubstituted C1 to C20 alkyl group, a substituted or unsubstituted C7 to C20 arylalkyl group, a substituted or unsubstituted C1 to C20 heteroalkyl group, a substituted or unsubstituted C3 to C20 cycloalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C6 to C20 aryl group, a substituted or unsubstituted C1 to C10 alkoxy group, a substituted or unsubstituted C1 to C30 acyl group, a hydroxy group, a halogen, or a combination thereof,
two or more of $R^{21}$ to $R^{26}$ are a substituted or unsubstituted C2 to C20 alkenyl group,
$Y^3$ is selected from a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof,
$0<M3<1$, $0<D3<1$, $0\leq T5<1$, $0\leq T6<1$, $0\leq Q3<1$, and $M3+D3+T5+T6+Q3=1$.

11. The curable organo polysiloxane composition as claimed in claim 10, wherein the compound represented by Chemical Formula 7 is included in the composition in an amount of about 0.1 wt % to about 20 wt %, based on a total weight of the composition.

12. The curable organo polysiloxane composition as claimed in claim 1, wherein the at least one second siloxane compound is included in the composition in an amount of about 50 wt % to about 89 wt %, based on a total weight of the composition.

13. An encapsulant obtained by curing the composition as claimed in claim 1.

14. An electronic device comprising the encapsulant as claimed in claim 13.

* * * * *